US009532484B2

(12) United States Patent
Franklin (10) Patent No.: US 9,532,484 B2
(45) Date of Patent: Dec. 27, 2016

(54) RACK FOR MOUNTING AND STORAGE OF ELECTRONIC EQUIPMENT (71) Applicant: UltraFrame Holdings, LLC, Reno, NV (US)

(72) Inventor: Barrett W. Franklin, Reno, NV (US)

(73) Assignee: ARA USA LLC, Reno, NV (US)

( * ) Notice: Subject to any disclaimer, the term of this patent is extended or adjusted under 35 U.S.C. 154(b) by 0 days.

(21) Appl. No.: 14/549,074

(22) Filed: Nov. 20, 2014

(65) Prior Publication Data

US 2015/0136714 A1 May 21, 2015

Related U.S. Application Data (60) Provisional application No. 61/906,566, filed on Nov. 20, 2013.

(51) Int. Cl.
*H05K 7/14* (2006.01)
*H05K 7/18* (2006.01)
*A47B 87/02* (2006.01)

(52) U.S. Cl.
CPC ......... *H05K 7/1495* (2013.01); *A47B 87/0276* (2013.01); *H05K 7/18* (2013.01)

(58) Field of Classification Search
CPC ...... H05K 7/1495; H05K 7/1488; H05K 7/18; H05K 5/0021; A47B 47/024; A47B 47/03; A47B 47/0083; A47B 87/008; A47B 87/0276
USPC ..... 361/724, 725, 730, 731; 312/198, 265.1; 211/153, 26
See application file for complete search history.

(56) References Cited

U.S. PATENT DOCUMENTS

| 2,710,784 | A | * | 6/1955 | Morin | A47B 47/03 312/265.1 |
| 3,851,764 | A | * | 12/1974 | Anders | A47B 63/067 198/797 |
| 4,949,648 | A | | 8/1990 | Miller | |
| 5,443,312 | A | * | 8/1995 | Schluter | H05K 7/1488 312/201 |
| 5,602,366 | A | * | 2/1997 | Whelan | H04R 1/026 181/144 |
| 5,938,302 | A | | 8/1999 | Anderson et al. | |
| 6,293,637 | B1 | | 9/2001 | Anderson et al. | |

(Continued)

FOREIGN PATENT DOCUMENTS

WO   WO 2011/000431   *   1/2011   ............. A47B 96/14

OTHER PUBLICATIONS

Notification of Transmittal of the International Search Report and Written Opinion of the International Searching Authority dated Feb. 27, 2015 in PCT/US2014/066648 (14 pages).

*Primary Examiner* — Michael Safavi
(74) *Attorney, Agent, or Firm* — Procopio Cory Hargreaves and Savitch LLP; Pattric J. Rawlins (57) ABSTRACT A storage system for mounting equipment includes a plurality of vertical structural side members positioned at corners of the storage system. A plurality of horizontal structural members are coupled to the plurality of vertical structural side members. Specifically, each of the horizontal structural members has a plurality of corners, and each corner of each horizontal structural member is coupled to one of the vertical structural side members. Each vertical structural side member is an extrusion having a length selected to accommodate a desired height in a facility in which the storage system is installed.

14 Claims, 10 Drawing Sheets (56) References Cited

U.S. PATENT DOCUMENTS

| | | | | |
|---|---|---|---|---|
| 8,668,283 | B2* | 3/2014 | Fan | H05K 7/1489 312/111 |
| 8,913,393 | B2* | 12/2014 | Mimlitch, III | H05K 7/1488 211/26 |
| 8,960,451 | B2* | 2/2015 | Florence, Jr. | H05K 7/1488 108/188 |
| 2001/0036399 | A1* | 11/2001 | Notohardjono | H02B 1/301 414/800 |
| 2003/0223196 | A1* | 12/2003 | Smith | G06F 1/181 361/679.48 |
| 2008/0231151 | A1* | 9/2008 | Barringer | G06F 1/182 312/223.2 |
| 2009/0277661 | A1* | 11/2009 | Schell | H02B 1/36 174/50 |
| 2010/0116545 | A1* | 5/2010 | Lewison | H05K 5/0021 174/520 |
| 2012/0292278 | A1 | 11/2012 | Schluter et al. | |
| 2013/0069501 | A1* | 3/2013 | Liu | H05K 7/18 312/223.1 |
| 2014/0263129 | A1* | 9/2014 | Tseng | H05K 7/1488 211/182 |

* cited by examiner

RACK FOR MOUNTING AND STORAGE OF ELECTRONIC EQUIPMENT

RELATED APPLICATIONS

This application is related to and claims the benefit of U.S. Provisional Patent Application No. 61/906,566, filed in the United States Patent and Trademark Office on Nov. 20, 2013, the entire contents of which are incorporated herein by reference.

This application is also related to U.S. Nonprovisional Patent Application No. 13/371,727, filed in the United States Patent and Trademark Office on Feb. 13, 2012, which was published on Aug. 15, 2013 as U.S. Patent Application Publication No. US 2013/0208420, the entire contents of which published application are incorporated herein by reference.

BACKGROUND

1. Technical Field

The present disclosure relates to high-density shelving and equipment storage systems and equipment storage management and more particularly to storing electronic and non-electronic equipment.

2. Discussion of Related Art

Datacenters are designed and constructed to optimize power and cooling requirements for a plurality of electric components such as power supplies, memory units, network appliances and servers. Since their introduction into datacenters, most of these electric devices have been adapted to fit into rack mountable appliance chassis. Rack mountable electric appliance chassis are typically constructed of steel sheet metal which adds considerable weight and mass to the overall electric component. In datacenters, the steel appliance chassis housing the electric components are then mounted into standardized equipment racks.

In general, equipment racks are produced in standard sizes such as "full height" that are approximately six feet in height, or "half high" racks that are approximately three feet in height. The equipment racks are designed to receive electronic appliances of variable height based upon a standardized scale referred to as the "Rack Unit", "RU" or "U", a unit of measure equal to 1.75 inches (44.45 mm). Thus, a standard full height 42U equipment rack could store forty-two 1U, or twenty-one 2U electronic component appliance chassis. The 19" rack mounting fixture includes two parallel metal strips (commonly referred to as "posts", "panel mounts" and "rack rails") standing vertically. The posts are 0.625 inch (15.88 mm) wide, and are separated by a distance of 17.75 inches (450.85 mm) for the mounting of the electronic equipment chassis, thus providing a front plane appliance attachment width of 19 inches (482.6 mm) and effectively limiting the maximum width of equipment to 17.75" (450.85 mm) with a minimum height of 1U or 1.75 inches (44.45 mm).

Known initially as "relay racks," equipment racks were adapted by the computer industry from 19-inch switching and signaling equipment racks originally introduced by the telecommunications and railroad industry in the late 19th century. Equipment racks initially included two posts and are, therefore, commonly known as "two-post racks." To accommodate larger electronic components, two sets of racks were implemented to support the front and back of larger electronic equipment chassis and are referred to as "four-post racks." Legacy datacenters were commonly constructed on a raised floor framework supporting 24" square removable floor tiles. Ultimately, four-post equipment racks were integrated into steel box cabinets with a standardized width of 24" (600-610 mm) that also aligns with the layout of raised floor tiles. Legacy equipment racks are typically 800 mm or 1000 mm in depth though specific depths vary from manufacturer to manufacturer. The industry standard four-post racks commonly found in datacenters today are typically enclosed in a steel cabinet and positioned in rows on 24-inch centers.

A difficulty of such a rack cabinet system is that the cabinet is typically shipped in assembled form with a significant cost of shipping at a fixed standard height to fit upright through the average door. This legacy equipment rack design effectively limits horizontal and vertical space utilization in the datacenter. It requires each 17.75-inch-wide stack of equipment chassis to occupy a 24-inch width of horizontal floor space, and limits vertical space utilization to the height of the static equipment rack design, not the ceiling height or equipment density potential of the datacenter.

Many other difficulties exist within current rack cabinet architectures. Although the typical rack cabinet is made of a steel or aluminum box frame construction for strength to handle the static loads of legacy rack mounted equipment, current design approaches add significant width and mass to the front profile and footprint of the rack cabinet without addressing the additional dynamic load requirements of modern high density equipment, specifically in potentially high-seismic-activity geographic regions. The current design limitations not only affect the size, but also the total mass of existing rack cabinet systems, significantly impacting material usage and floor space utilization while failing to meet the potential dynamic load requirements in seismically active areas. Inversely, the current seismically engineered and rated racks that are available to address modern dynamic load requirements extend the mass and material usage of steel or aluminum box construction even further. This adds even more weight, mass and cost to the rack cabinet, without reducing the overall footprint, or increasing space utilization in the modern data center.

Though much has changed in computing and telecommunications equipment over the past decades, there has been relatively little change in equipment rack design and to better address the densities and efficiencies of modern electronic components and how they are utilized. This not only affects the size, but also the total mass of existing rack cabinet systems, significantly impacting material usage and floor space utilization. As data centers adopt virtualization and cloud computing to achieve higher levels of efficiencies utilizing large arrays of dense homogeneous power-efficient equipment, the current art of rack cabinet equipment significantly limits more efficient datacenter designs as well as the utilization of space in existing facilities.

SUMMARY

According to one aspect, a storage system for mounting equipment is provided. The storage system includes a plurality of vertical structural side members positioned at corners of the storage system. The storage system also includes a plurality of horizontal structural members coupled to the plurality of vertical structural side members, each of the horizontal structural members having a plurality of corners, each corner of each horizontal structural member being coupled to one of the vertical structural side members. Each vertical structural side member is an extrusion having a length selected to accommodate a desired height in a facility in which the storage system is installed.

In some exemplary embodiments, the equipment is electronic equipment. In some exemplary embodiments, the storage system has a width of 480 mm to 500 mm, and the equipment mounted in the storage system has a standard width of approximately 450 mm.

In some exemplary embodiments, the storage system comprises a plurality of framework assemblies coupled together. In some exemplary embodiments, the plurality of framework assemblies are coupled together side-by-side. Each framework assembly can include four vertical structural side members coupled to at least two horizontal structural members. Each horizontal structural member can include at least one modular coupling hole used in coupling the plurality of framework assemblies together.

In some exemplary embodiments, the storage system further comprises at least one accessory coupled to the storage system. Each horizontal structural member can include at least one structural accessory coupling hole used in coupling the accessory to the storage system.

In some exemplary embodiments, the accessory comprises a seismic adapter subsystem for protecting the storage system from damage associated with seismic activity. The seismic adapter subsystem can be coupled to at least one of the horizontal structural members. The seismic adapter subsystem can include a plurality of seismic adapter bases coupled to the storage system. The seismic adapter subsystem can include at least one seismic adapter brace coupled to a pair of seismic adapter bases. The pair of seismic adapter bases can be coupled to a respective pair of framework assemblies which are coupled together in the storage system, such that the at least one seismic adapter brace extends from one of the pair of framework assemblies to the other of the pair of framework assemblies. Each framework assembly can include four vertical structural side members coupled to at least two horizontal structural members. The plurality of framework assemblies can be coupled together side-by-side. Each horizontal structural member can include at least one modular coupling hole used in coupling the plurality of framework assemblies together.

In some exemplary embodiments, the seismic adapter subsystem comprises at least one seismic adapter plate coupled to the storage system.

In some exemplary embodiments, each horizontal structural member includes a plurality of module coupling holes used in aligning and coupling the horizontal structural member to a vertical structural side member.

In some exemplary embodiments, each horizontal structural member includes a mounting feature such that at least one of a top plane and bottom plane of a first framework assembly can be coupled to at least one of a top plane and bottom plane of a second framework assembly, such that the first and second framework assemblies are stacked in the system.

BRIEF DESCRIPTION OF DRAWINGS

The foregoing and other features and advantages will be apparent from the more particular description of preferred aspects, as illustrated in the accompanying drawings in which like reference characters refer to the same parts throughout the different views. The drawings are not necessarily to scale, emphasis instead being placed upon illustrating the principles of the disclosure.

DETAILED DESCRIPTION

The present disclosure relates to high-density shelving and equipment storage systems and equipment storage management. Specifically, the present disclosure is directed to a seismically engineered, structurally integrated, highly space-efficient building-block rack framework for storing electronic and non-electronic equipment. The systems of the disclosure can be mechanically interconnected and adapted for high levels of dynamic load strength in a superior space efficient format.

In accordance with some embodiments, a modular building block rack framework comprises vertical structural side members, which can be made by an extrusion process or other manufacturing process. The vertical structural side members can be cut to length to efficiently optimize the available vertical ceiling height of a given facility in which the system is to be installed. The vertical structural side members are implemented to withstand and transfer the vertical load of a plurality of direct-mounted or rack-rail-mounted electronic or non-electronic equipment appliance chassis in a very space-efficient manner. In some exemplary embodiments, the vertical structural side members also may contain a feature to receive self-tapping screws to enable direct coupling of electronic equipment chassis, thereby eliminating the need for rack rails. In some exemplary embodiments, the vertical structural side members are symmetrical, which results in only one part being required for all orientations in a given assembly. This symmetry in the vertical structural side members further enhances the manufacturing efficiency of the overall building-block framework of the system of the disclosure.

The modular building-block framework of the disclosure also comprises a plurality of horizontal structural members. The horizontal structural members may include predetermined symmetrical mounting patterns on the top and bottom planes of the horizontal structural members to enable efficient structural coupling when a plurality of building block frameworks are optionally stacked, as described below in detail, and for efficient structural anchoring at the base when required. The horizontal structural members may include predetermined symmetrical mounting patterns on the side planes of the horizontal structural members that enable the efficient coupling of the vertical structural side members, and for mounting a plurality of optional side-mounted fitments to the horizontal structural member, and to couple a plurality of modular building block frameworks together in a side-to-side manner.

The horizontal structural members may include predetermined symmetrical mounting patterns on the front and back planes of the horizontal structural members that enable for the efficient coupling of a plurality of optional fitments, such as, equipment chassis mounting rack rails, seismic anchoring brackets, and seismic bracing kits. In some exemplary embodiments, the seismic bracing kits can be efficiently added in an incremental manner to meet the equipment weight and seismic requirements of a given configuration weight, in a given geographic location. A plurality of optional equipment mounting rails, shelf systems, wire management systems, security doors and other features, which can be, for example, formed sheet metal and/or fixtures which can be formed by extrusion, molding or other process, can also be attached to the predetermined symmetrical mounting patterns to meet the individual requirements of any given implementation.

According to some exemplary embodiments, a building-block rack framework can optionally be shipped as individual components to an installation site and assembled onsite in an efficient manner. The vertical structural side members can optionally be precut to optimize the ceiling height of an installation. Also, or alternatively, the vertical structural side members can be cut to length onsite at the installation, and/or can be cut to order on a factory assembly line. The flexibility of the system of the disclosure increases site optimization and deployment configuration options while decreasing manufacturing costs. The building-block rack framework modules can also be pre-assembled and loaded with integrated electronic and non-electronic equipment at an optimal height and weight, facilitating global multimodal shipping of fully integrated equipment blocks that can then be stacked to a desired height at a given facility enabling greater manufacturing efficiency, shipping efficiency and implementation efficiency onsite. The resultant high-density building-block framework can be efficiently adapted to maximize the optimal height and density for a given installation facility. The framework can also be structurally adapted through the use of optional seismic bracing kits to meet the seismic requirements of an installation facility for a given geographic location. According to exemplary embodiments, the building-block framework module can be symmetrically configured to couple to other building-block framework modules side-to-side on the same plane, and optionally stacked and coupled in vertical columns with minimal mechanical effort.

Figure 1:
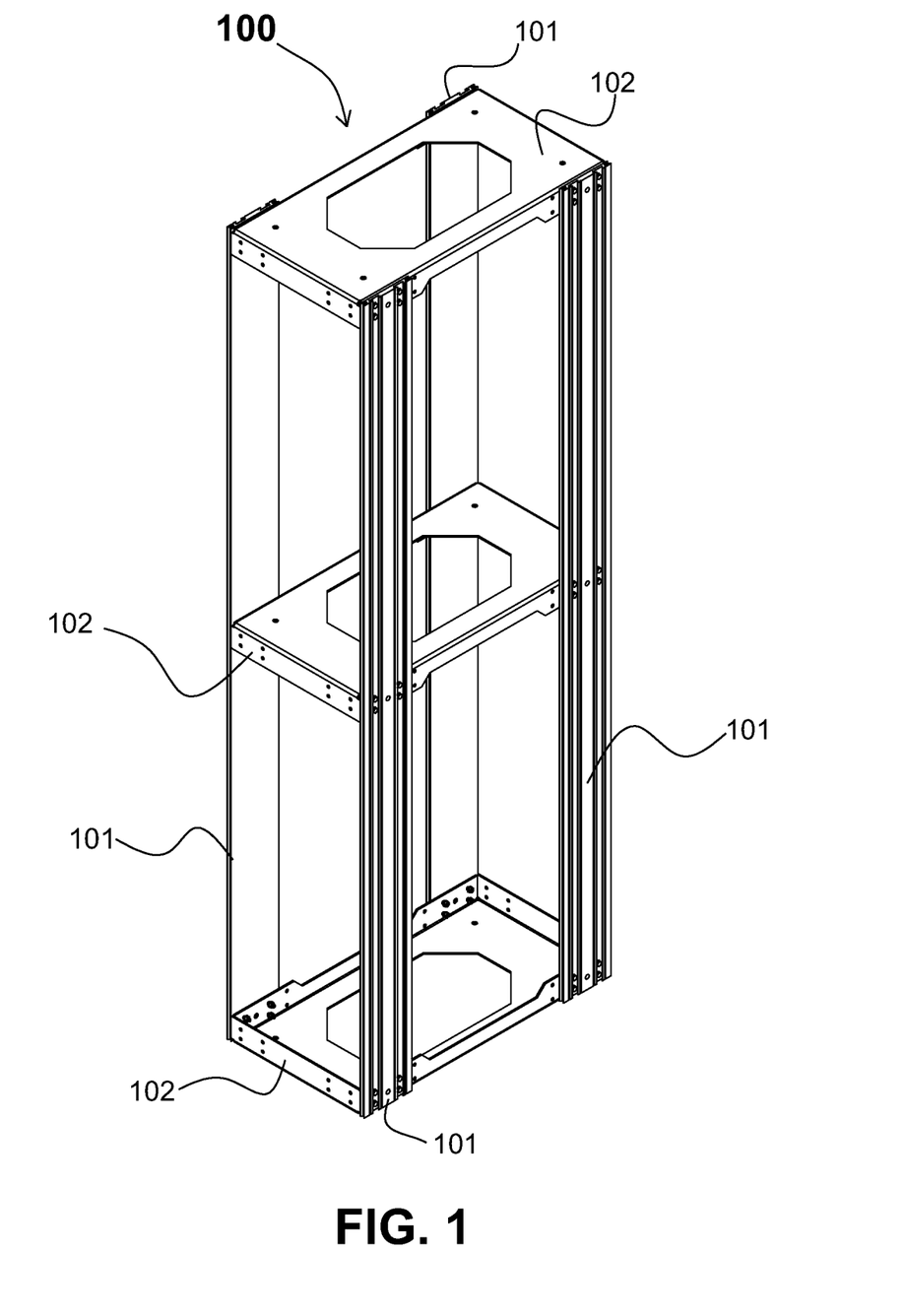
FIG. 1 includes a schematic perspective view of a building-block rack framework assembly, in accordance with some embodiments.
Figure 2A:
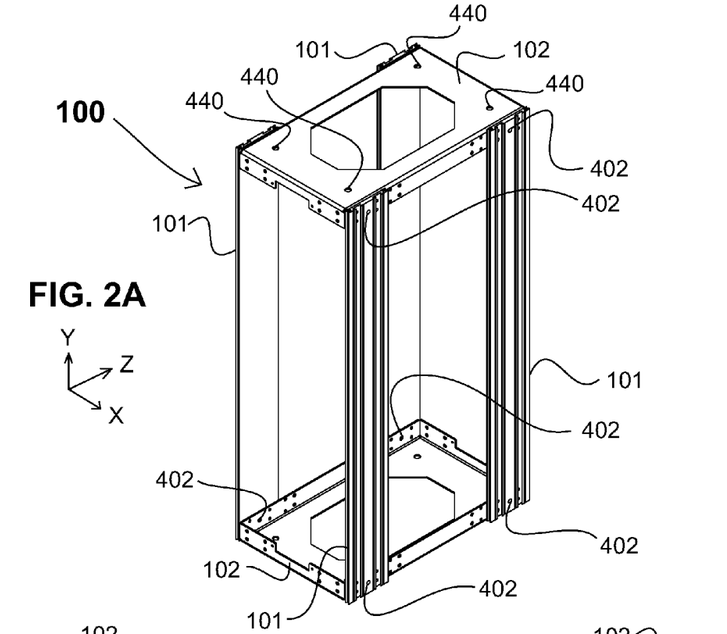
FIGS. 2A, 2B and 2C include a schematic perspective view, a schematic front view, and a schematic side view, respectively, of a building-block rack framework assembly, in accordance with some embodiments.
Figure 2B:
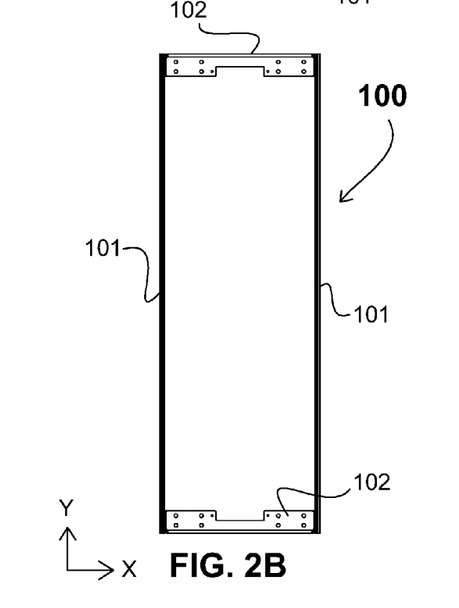
Figure 2C:
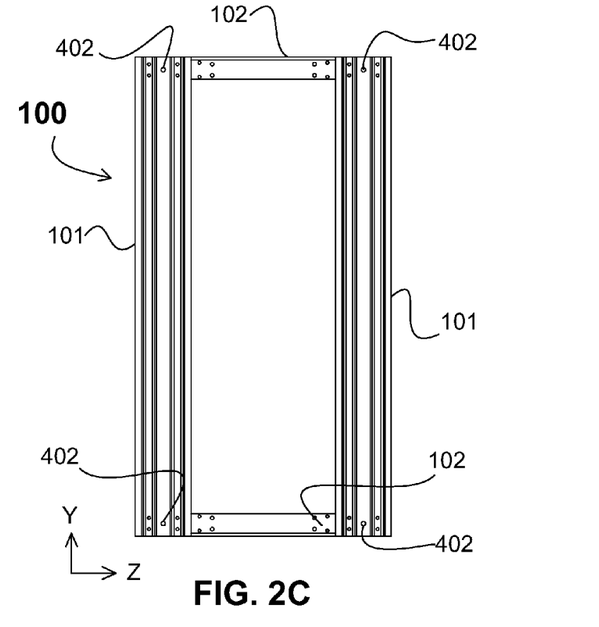

FIG. 1 includes a schematic perspective view of a building-block rack framework assembly, in accordance with some embodiments. FIGS. 2A, 2B and 2C include a schematic perspective view, a schematic front view, and a schematic side view, respectively, of a building-block rack framework assembly, in accordance with some embodiments. Referring to FIGS. 1 and 2A-2C, building-block rack framework assembly 100 is part of a system for storing electronic and/or non-electronic equipment in a highly space-efficient, structurally integrated manner. As shown, four vertical structural side members 101 are coupled to a plurality of horizontal structural members 102 by a plurality of fasteners at coupling junctions 402 to form building block rack framework assembly 100. In some exemplary embodiments, vertical structural side members 101 can be formed by extrusion, thus increasing the efficiency and cost effectiveness of the manufacturing process. In some particular embodiments, vertical structural side members 101 can be extruded metal, such as extruded aluminum, or other similar material. In some alternative embodiments, vertical structural side members 101 can be formed by some other manufacturing process, such as stamping, molding or otherwise forming steel or carbon fiber or other similar material. Due to the symmetrical implementation of vertical structural side members 101, all vertical structural side members 101 utilize one common part in the present embodiment. Similarly, due to the symmetrical design of the horizontal structural members 102, all horizontal structural members utilize one common part in the present embodiment. Therefore, vertical structural side members 101 and horizontal structural members 102 are economical to manufacture, since they represent singular elements needed to implement all vertical structural side members, and all horizontal structural members, respectively.

Figures 3A, 3B, 3C:
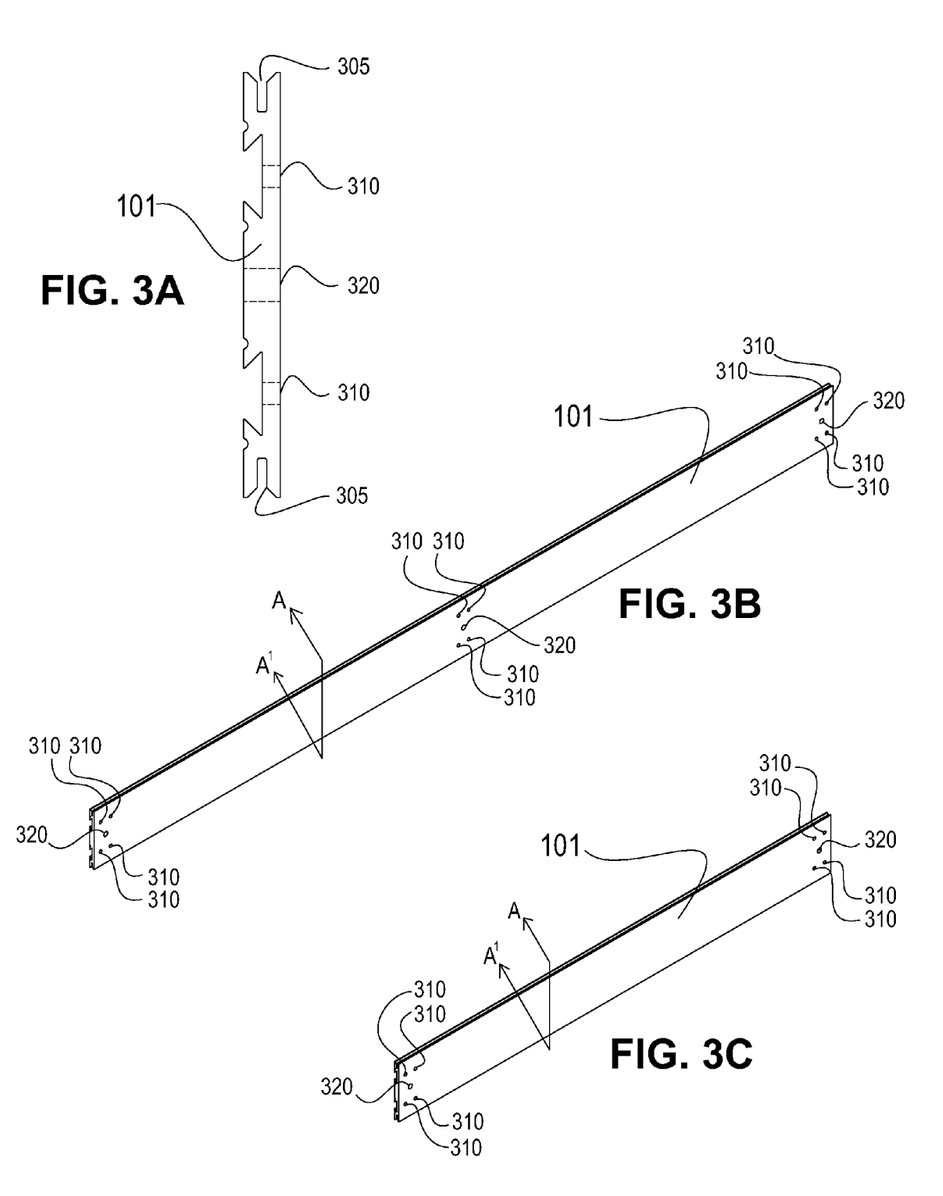
FIG. 3A includes a schematic cross-sectional view of an extruded vertical structural side member of a rack framework assembly, taken along line 3A-3A of FIG. 3B or line 3A-3A of FIG. 3C, in accordance with some embodiments.
FIG. 3B includes a schematic perspective view of an extruded vertical structural side member of a rack framework assembly, as illustrated in FIG. 3A, in accordance with some embodiments.
FIG. 3C includes a schematic perspective view of an extruded vertical structural side member of a rack framework assembly, as illustrated in FIG. 3A, in accordance with some embodiments.

FIGS. 3A, 3B and 3C include a schematic cross-sectional view and two schematic perspective views, respectively, of an exemplary extruded vertical structural side member 101 illustrated in FIGS. 1, 2A, 2B, and 2C, according to some embodiments. Continuing to refer to FIGS. 1 and 2A-2C, in some exemplary embodiments, vertical structural side members 101 have a length which is selectable according to the desired height of assembly 100 in the facility in which assembly 100 is installed. For example, in some embodiments, vertical structural side members 101 can be cut to length to optimize the available vertical ceiling height of a given facility. Vertical structural side members 101 are designed to withstand and transfer the vertical load of a plurality of rail or shelf mounted electronic or non-electronic equipment modules. As illustrated in the cross-sectional view of FIG. 3A, vertical structural side member 101 may include a self-tapping screw receiver channel 305 formed in the front and rear leading edges vertical structural side member 101 to enable optional direct attachment of computer chassis equipment and other optional fitments with the use of self-tapping screws. A plurality of module coupling holes 310 and 320 on vertical structural side member 101 may be used to align and couple vertical structural side member 101 to horizontal structural member 102 to form modular building block framework assembly 100.

Figure 2D:
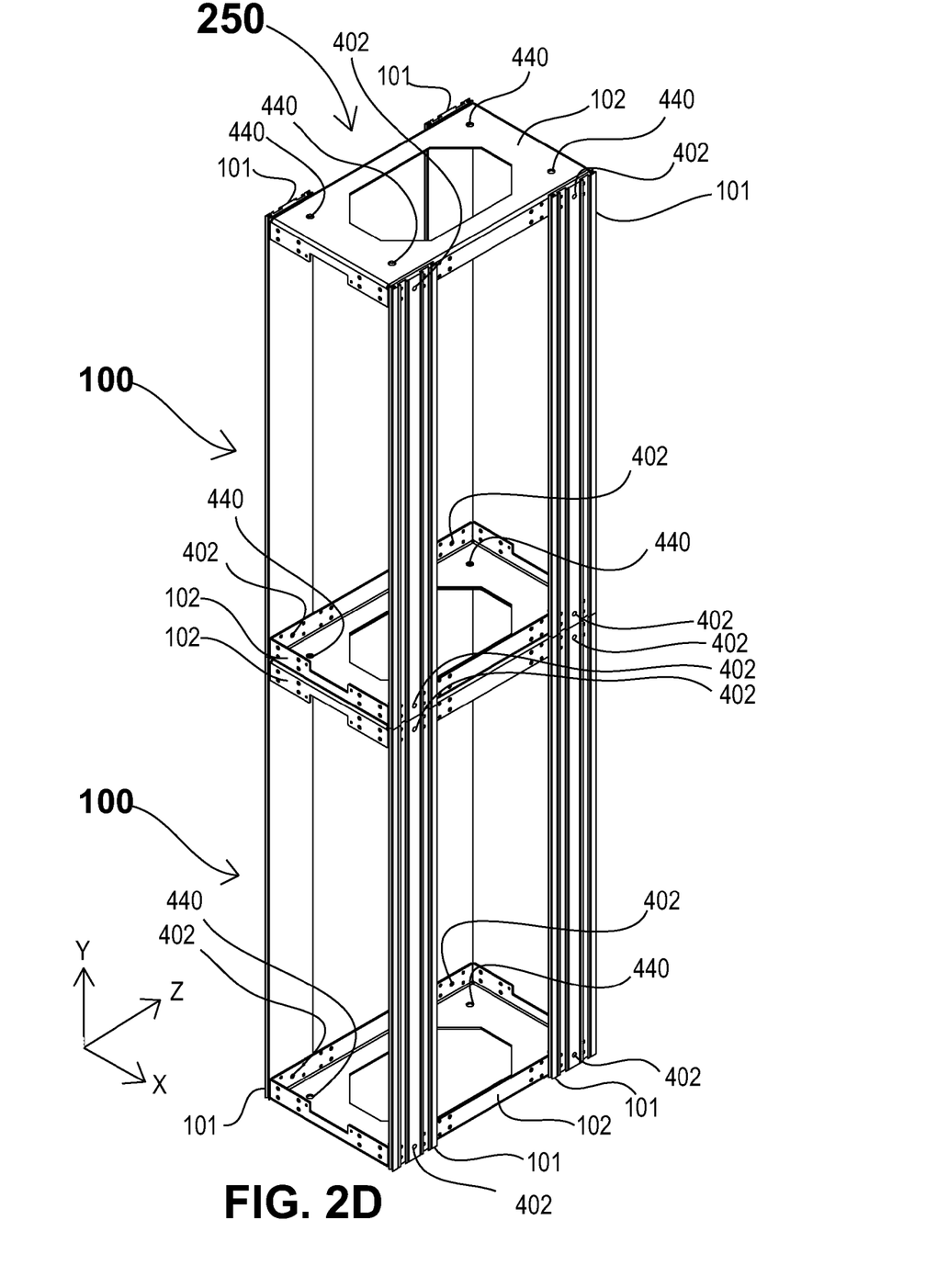
FIG. 2D includes a schematic perspective view of two building-block rack framework assemblies stacked and coupled into a vertical column, in accordance with some embodiments.

In general, the present disclosure is applicable to a building-block framework assembly 100 having any selected height, width and depth. However, in some particular exemplary embodiments as illustrated in FIGS. 2A, 2B and 2C, the height Y of each building-block rack framework module 100 is 1.5-meters, providing 30U of equipment storage that can be stacked and coupled to another 1.5-meter 30U assembly 100, as illustrated in FIG. 2D, for a system 250 having a total vertical height of 3.0 meters and 60U of equipment storage in each vertical column, with a width X of 480 mm to 500 mm in the present embodiment to accommodate legacy 17.75" equipment chassis, and a depth Z of 800 to 1220 mm. According to some exemplary embodiments, adjustments can be made in, for example, the width X and depth Z of horizontal structural member 102 to facilitate equipment designed for 23" equipment chassis, or to attain any other equipment width or depth if mounting legacy equipment chassis is not required.

Figure 4A:
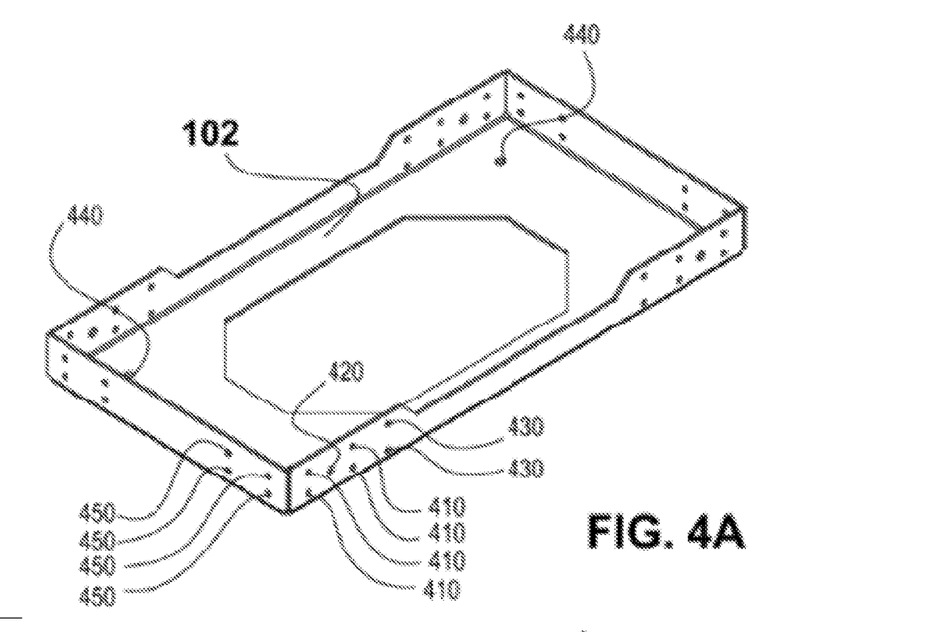
FIG. 4A includes a schematic perspective view of a horizontal structural member of a rack framework assembly, in accordance with some embodiments.
Figure 4B:
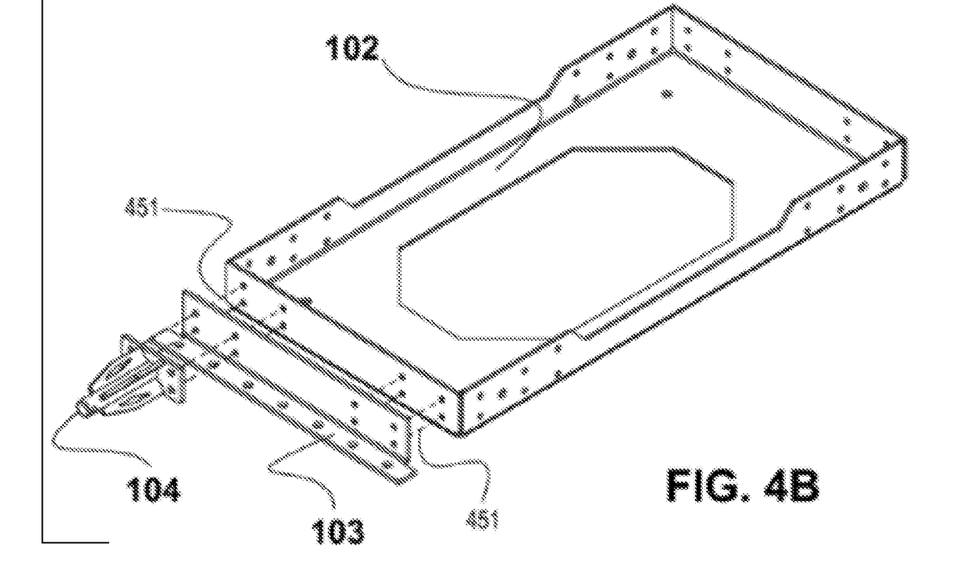
FIG. 4B includes a schematic perspective exploded view of a horizontal structural member of a rack framework assembly with optional fitments, in accordance with some embodiments.

FIG. 4A includes a schematic perspective view of a horizontal structural member of a rack framework assembly, in accordance with some embodiments. FIG. 4B includes a schematic perspective exploded view of a horizontal structural member of a rack framework assembly with optional fitments, in accordance with some embodiments.

Referring to FIGS. 2A, 4A and 4B, horizontal structural members 102 may include predetermined symmetrical mounting features 440 on the top and bottom plane of building-block framework assembly 100 to enable efficient structural coupling when a plurality of building block framework assemblies 100 are optionally stacked, or for efficient structural anchoring at the bottom or base of assembly 100 when required. A plurality of module coupling holes 410 located in symmetrical patterns on the side planes of horizontal structural member 102 may be used to align and couple vertical structural side member 101 to horizontal structural member 102 to form modular building block framework assembly 100. A plurality of side accessory coupling holes 430 located in symmetrical patterns on the side planes of horizontal structural member 102 may be used to efficiently attach optional fitments, such as, for example, shelf rail kits. A plurality of front and back structural accessory coupling holes 450 located in symmetrical patterns on the front and back planes of horizontal structural member 102 may be used to efficiently attach optional structural fitments, such as, for example, seismic anchor plate 103 and seismic adapter kit bracket 104. A plurality of other optional fitments, such as, for example, equipment mounting rails, wire management systems, security doors, power distribution and other formed sheet metal, extruded, molded or otherwise-formed fixtures can also be attached to the predetermined symmetrical mounting patterns 451 to meet the individual requirements of any given implementation. A plurality of module coupling holes 420 located in symmetrical patterns on the side planes of horizontal structural member 102 may be used to enable efficient coupling of a plurality of building block framework assemblies 100 in a side-to-side manner to form the structurally integrated framework system.

FIG. 2D includes a schematic perspective view of two building-block rack framework assemblies 100 stacked and coupled into a vertical column system 250, in accordance with some exemplary embodiments. Referring to FIGS. 2A-2D, individual building-block rack framework assemblies 100 can be stacked to increase equipment manufacturing efficiency, facilitate international multimodal shipping and accelerate onsite deployment, thus lowering cost throughout the entire supply chain. By utilizing predetermined symmetrical mounting features 440 to vertically align and couple building-block rack framework assembly 100 at the predetermined symmetrical mounting features 440, the vertically coupled building-block rack framework assemblies 100 become one structurally integrated rack framework column 250.

Figure 5A:
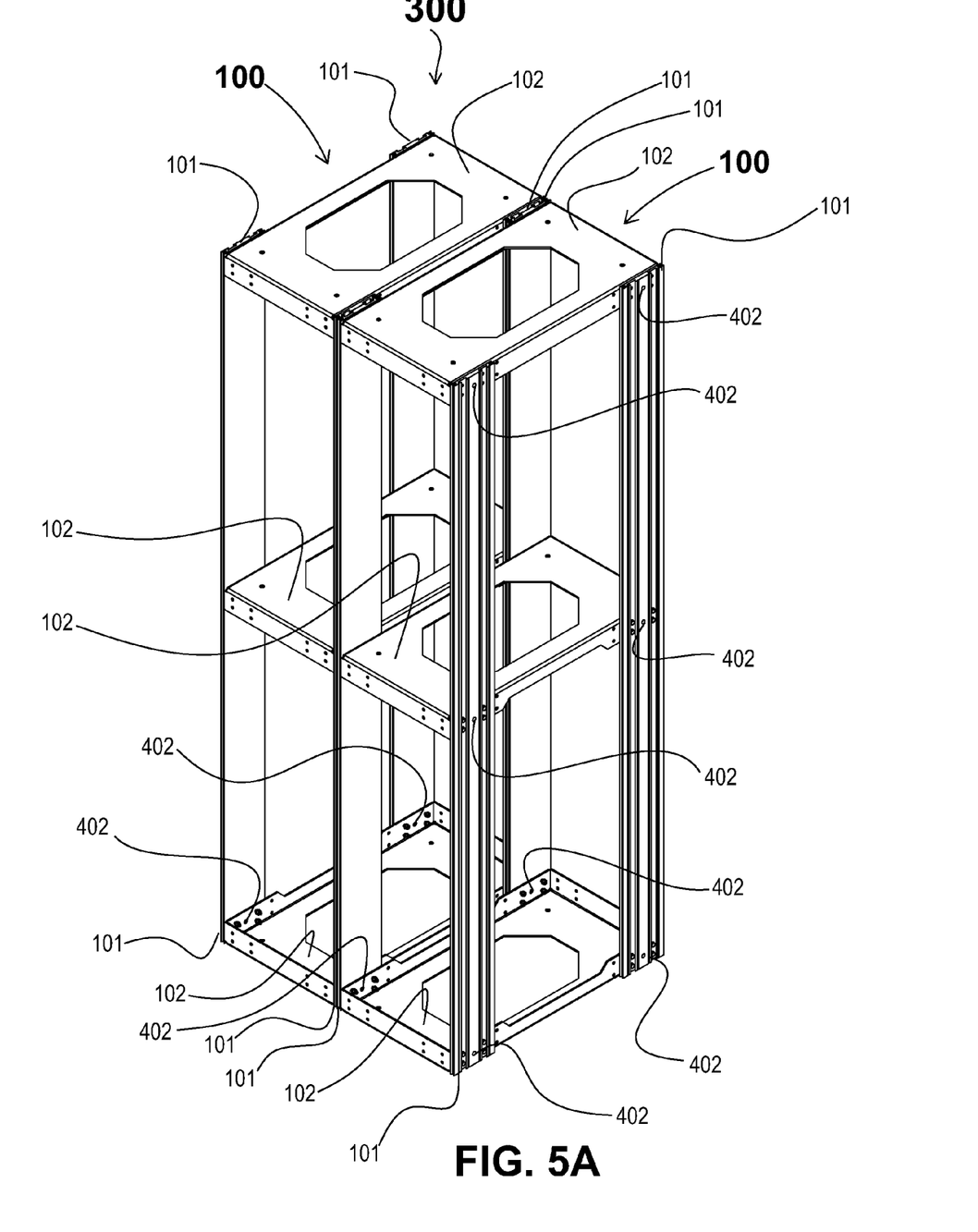
FIGS. 5A, 5B and 5C include schematic perspective views of a plurality of coupled building block rack framework assemblies, in accordance with some embodiments.

FIG. 5A includes a schematic perspective view of a plurality of building-block rack framework assemblies 100 coupled into a rack framework system 300, in accordance with some embodiments. Referring to FIGS. 1, 2A-2C, 3A-3C, 4A, 4B and 5A, horizontal structural members 102 transfer dynamic loads from vertical structural side members 101 through the interlocking framework of coupled building-block rack framework assemblies 100. The interlocking framework of coupled building-block rack framework assemblies 100 illustrated in FIG. 5A is created by coupling a plurality of modular building-block framework assemblies 100 together at the coupling junctions 402 of each horizontal structural member 102. According to the exemplary embodiments, the binding of the common vertical structural side members 101 through the interlocking horizontal structural members 102 allows for space-efficient narrow vertical structural side members 101 that recapture much of the space lost in the width of traditional box-frame rack cabinet architectures without compromising dynamic seismic load capabilities. According to the embodiments, the efficient narrow structural vertical side member 101, structurally reinforced by the coupling junctions 402 of the horizontal structural members 102, allows for modular building-block rack framework assemblies 100 as narrow as 480-500 mm that hold standard 450 mm rack-mountable chassis equipment. This represents a density increase of over 20% when compared to standard 24-inch-wide equipment racks. Additional density increases of 2-30% can be achieved by extending the length of vertical structural side members 101 to better optimize vertical free space in a datacenter. According to the exemplary embodiments, these two aspects of the present disclosure used together can attain density increases in excess of 20-50% in the average datacenter over standard 42U, 24-inch-wide equipment racks.

Figure 5B:
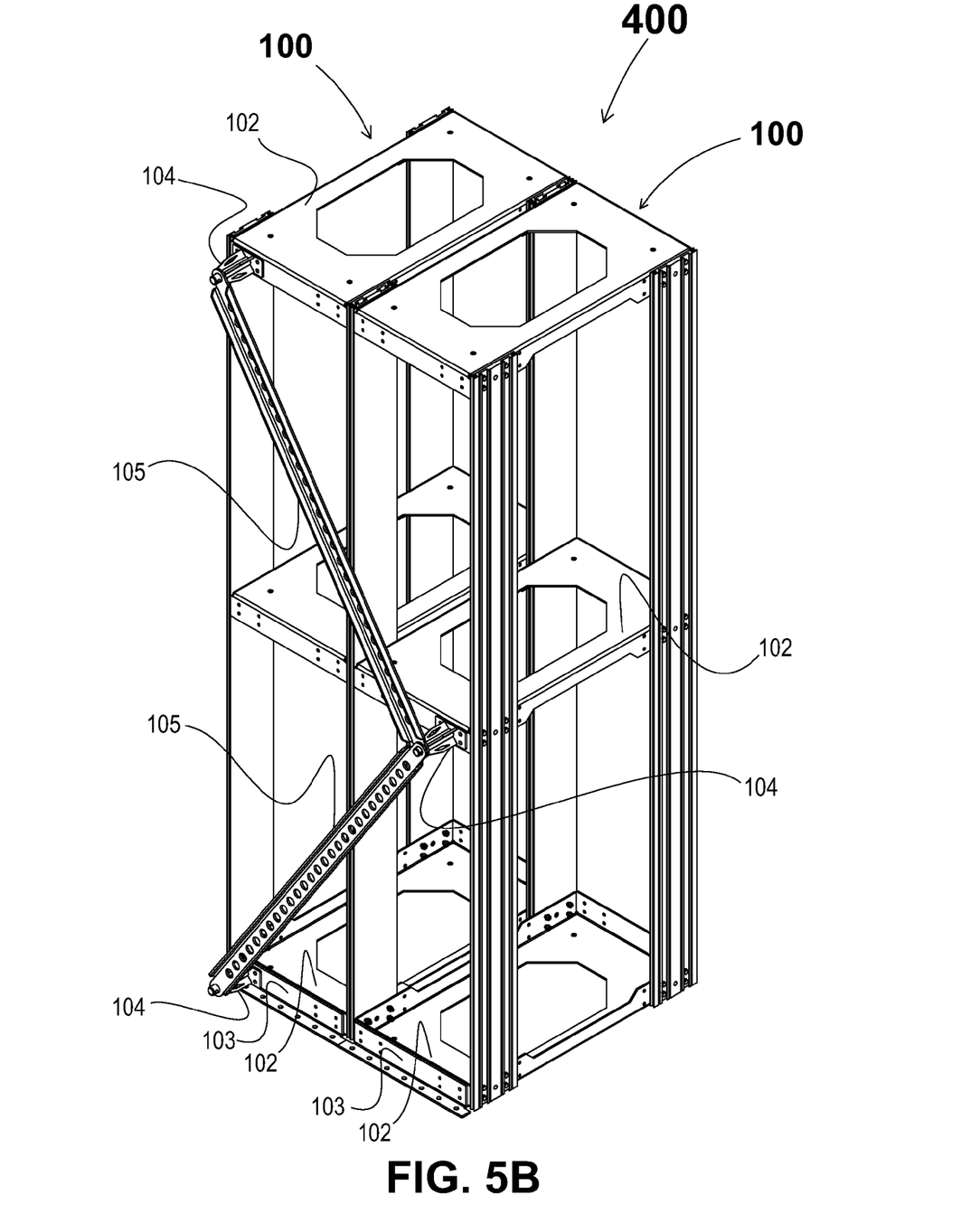
Figure 5C:
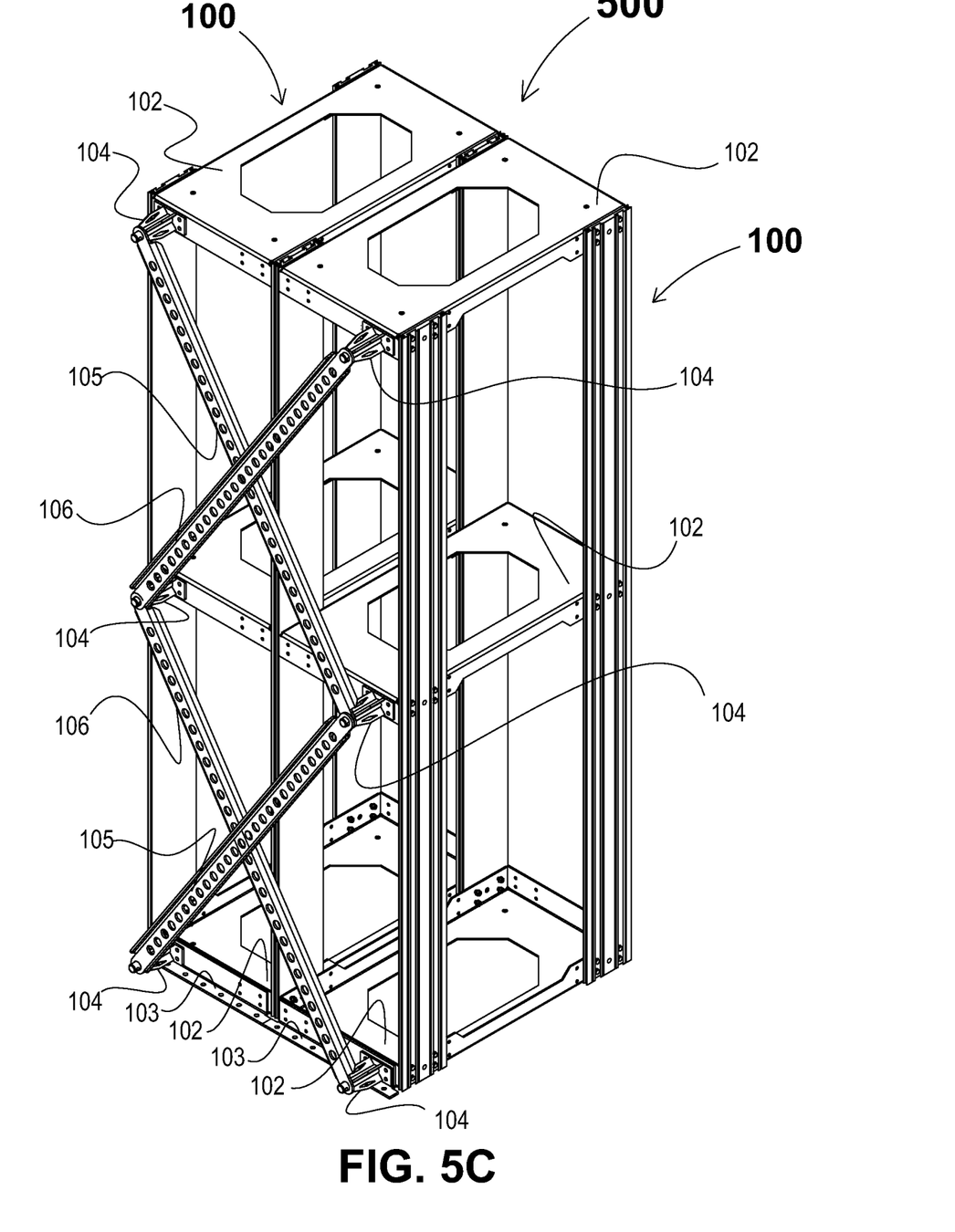

FIGS. 5B and 5C include additional schematic perspective views of building-block rack framework assemblies 100 coupled into rack framework systems 400 and 500, respectively, with exemplary seismic adapter kits installed. The seismic structural elements of building block framework systems 400 and 500 can be divided into at least two structurally complementary feature sets. As illustrated in FIGS. 2A-2C, for example, vertical structural side members 101, having a thin planar design, when coupled to horizontal structural side members 102, make the building-block rack framework 100 rigid on the Y and Z axes, while maintaining an exceptionally narrow footprint for the building-block rack framework assembly 100 on the X axis. Seismic bracing kits illustrated in FIGS. 5B and 5C can then be optionally mounted in a plurality of incremental orientations on the front and rear surfaces of horizontal structural side members 102, thereby stiffening building-block rack framework assembly 100 on the X and Y axes in a highly space efficient manner, external to the electronic and non-electronic equipment mass.

FIGS. 5B and 5C illustrate seismic adapter brackets 104 coupled to horizontal structural side member 102. Two seismic adapter braces 105 can be coupled to seismic adapter brackets 104 to meet the dynamic load requirements for a specific application and seismic region. FIG. 5C illustrates an example of two seismic adapter kits with the addition of three seismic adapter brackets 104 coupled to horizontal structural members 102, with two additional seismic adapter braces 106 coupled to the additional set of seismic adapter brackets 104 to meet incrementally greater dynamic load requirements and possible more stringent seismic requirements for a geographic region with higher seismic activity.

Figure 6:
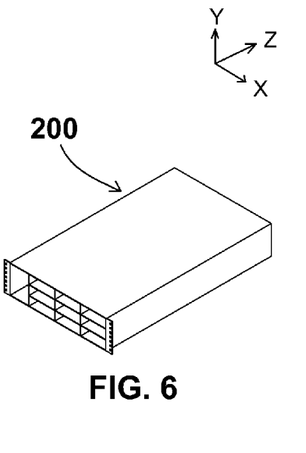
FIG. 6 includes a schematic perspective view of an exemplary 3U rack-mountable computer chassis to which the system of the disclosure is applicable, in accordance with some embodiments.

FIG. 6 includes a schematic perspective view of an exemplary 3U rack-mountable computer chassis to which the system of the disclosure is applicable, in accordance with some embodiments. Referring to FIG. 6, an exemplary 3U rack-mountable computer chassis 200 would conventionally be installed and integrated into a legacy 24" computer rack after the computer rack was installed at the installation location. This is typically referred to as "rack and stack" in the data center industry. One disadvantage to such an approach is that the onsite integration is labor intensive and requires a plurality of specialized skillsets to be performed onsite at an elevated cost to the end customer.

Figure 7A:
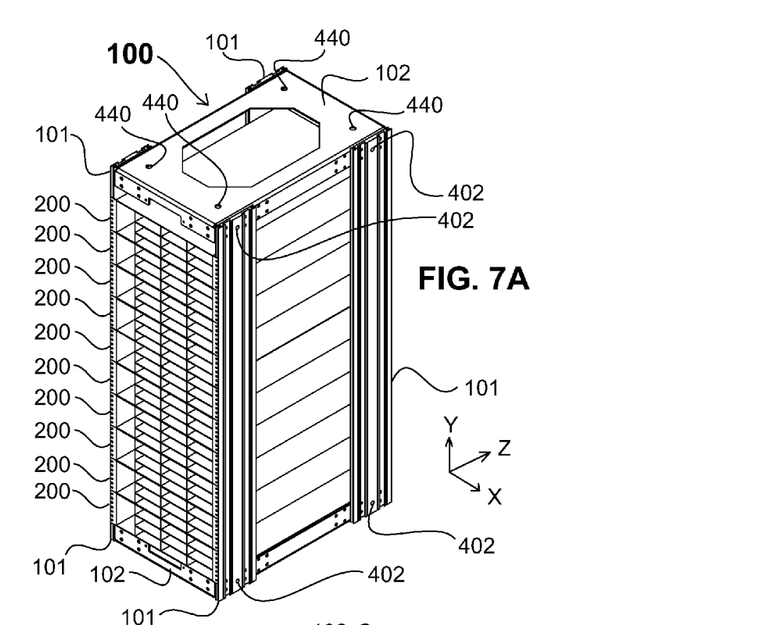
FIGS. 7A, 7B and 7C include a schematic perspective view, a schematic front view, and a schematic side view, respectively, of a building-block rack framework assembly populated with a plurality of 3U exemplary rack-mountable computer chassis, in accordance with some embodiments.
Figure 7B:
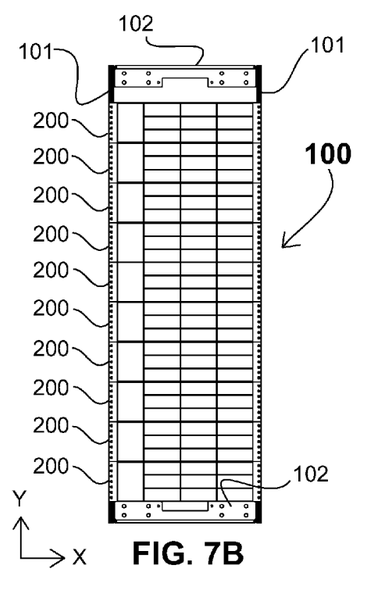
Figure 7C:
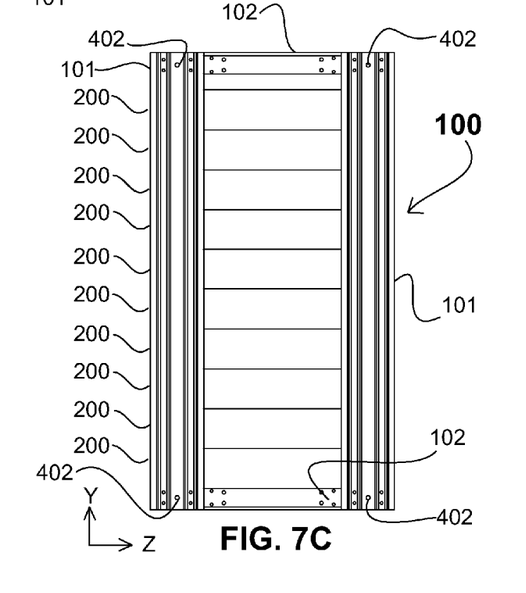
Figure 8:
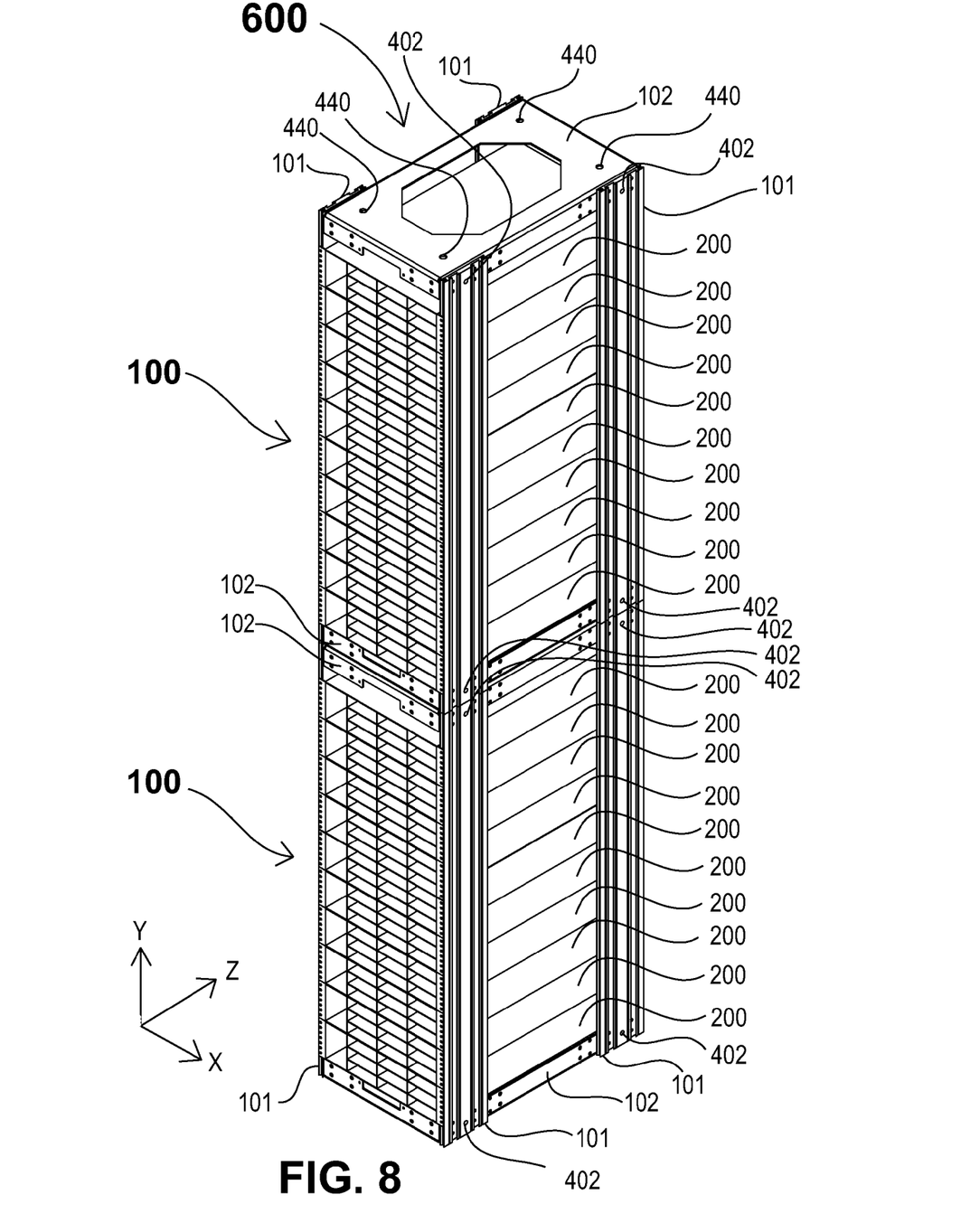
FIG. 8 includes a schematic perspective view of two building-block rack framework assemblies stacked and coupled in a vertical column populated with a plurality of exemplary 3U rack mountable computer chassis, in accordance with some embodiments.

FIGS. 7A, 7B and 7C include a schematic perspective view, a schematic front view, and a schematic side view, respectively, of a building-block rack framework assembly 100 populated with a plurality of exemplary 3U rack-mountable computer chassis 200, in accordance with some embodiments. FIG. 8 includes a schematic perspective view of two building-block rack framework assemblies 100 populated with a plurality of exemplary 3U rack-mountable computer chassis 200, and stacked and coupled into vertical building-block rack framework column 600.

Referring to FIGS. 7A-C and 8, integration of a plurality of equipment chassis, such as the exemplary 3U rack-mountable computer chassis 200 illustrated in FIG. 6, could optionally be performed onsite, or alternately in advance of delivery on a factory floor by the manufacturer, and then shipped to the installation location as a fully integrated unit. The advantage to the latter approach is that installation, integration and even pre-configuration services can all be performed prior to delivery at a much lower cost, then more cost effectively shipped to the final location in a much more modal shipping unit than a traditional 42U 24" rack. Then, the integrated building-block rack framework assemblies 100 can be optionally anchored, stacked and coupled to an optimal-height building-block rack framework column 600. This optional solution not only lowers the integration cost and facilitates shipping, it also enables maximum utilization of vertical space in the facility, e.g., datacenter. In some exemplary embodiments, a plurality of building-block rack framework column 600 can then be coupled side-to-side into structurally integrated, seismically reinforced rows as illustrated in FIGS. 5A-5C.

Due to the symmetrical design of the building-block rack framework assembly 100, such seismic adapter kits can be added to the front of the unit, back of the unit, or both. This creates a highly efficient seismic bracing approach that can be incrementally added to equipment rack framework assemblies 100 in a cost effective manner, without increasing the spatial mass of the building block framework on the Z and Y axis. This enables equipment density increases in excess of 25-50%, while increasing dynamic load capacities 100-200% over standard 42U, 24" (609.6 mm) wide equipment racks.

In some exemplary embodiments, building-block rack framework assembly 100 of the disclosure can be optionally preassembled and shipped to an installation location. Alternatively, individual components of building-block rack framework assembly 100 can be shipped to an assembly location or to an installation location, and then assembled at the assembly location or installation location. Side members can be optionally precut in advance to optimize the ceiling height of an installation, or can be cut to length on location. A plurality of optional fitments including equipment mounting rails, shelf systems, wire management systems, security doors and other sheet metal, extruded or molded fixtures can also be attached to meet the special requirements of any given implementation.

According to some embodiments, a structurally integrated modular shelf frame equipment storage system can be built according to a user's specific needs that best utilize the capability of given facility. The systems, modules and methods described herein provide an efficient approach to storing equipment and reducing infrastructure cost. The flexibility and scalability of the structurally integrated modular shelf frame systems, modules and methods described herein satisfy those needs, as well as others.

For instance, in some embodiments, because the structurally integrated system is modular, building-block framework assemblies can be fully pre-populated with equipment and wire management, and then shipped to a given location. There they can be modularly stacked and coupled without the need for existing equipment rack infrastructure, or optionally mounted into existing equipment racks. Additionally, this modularity aids in the task of physically relocating equipment by eliminating the need to remove individual components.

Although the present invention has been described in accordance with the embodiments shown, one of ordinary skill in the art will readily recognize that there could be variations to the embodiments and those variations would be within the spirit and scope of the present invention. For instance, the shelf frame modules described in detail above could be coupled using another method or using alternative geometric shapes to those described above, or the height and width of the members can vary depending on the user's needs. Also, although a finite number of high-density shelving and equipment storage systems are described in connection with the embodiments, it is clear that any number or even one high-density shelving and equipment storage system could be utilized according to the disclosure. Accordingly, many modifications may be made by one of ordinary skill in the art without departing from the spirit and scope of the appended claims.

The invention claimed is:

1. A seismic modular electronic storage rack assembly for mounting electronic equipment, comprising:
   a plurality of vertical structural side members;
   a plurality of horizontal structural members coupled to the plurality of vertical structural side members, each of the horizontal structural members having a front face, a back face, a first side face and a second side face, wherein the plurality of horizontal structural members include at least a first horizontal structural member, a second horizontal structural member and a third horizontal structural member wherein the second horizontal structure is positioned between the first and third horizontal structures of the storage rack assembly, and wherein
      a first vertical structural side member is coupled to each of the horizontal structural members on respective first side faces and positioned proximal to the front face, and
      a second vertical structural side member is coupled to each of the horizontal structural members on respective first side faces and positioned proximal to the back face, and
      a third vertical structural side member is coupled to each of the horizontal structural members on respective second side faces and positioned proximal to the back face, and a fourth vertical structural side member is coupled to each of the horizontal structural members on respective second side faces and positioned proximal to the front face;

a first seismic anchor plate coupled to the front face of the first horizontal structural member between the first vertical structural side member and the fourth vertical structural side member; and one or more seismic adaptor kits comprising a plurality of seismic adaptor brackets and at least one seismic brace, wherein each seismic adaptor bracket is configured for mounting to a front surface of a seismic anchor plate or a front or rear face of a horizontal structural member, wherein a first seismic adaptor kit comprises a first seismic brace adapted to couple between a first seismic adaptor bracket and a second seismic adaptor bracket, wherein the first seismic adaptor bracket is coupled to the first seismic anchor plate proximal to the first vertical structural side member, and wherein the second seismic adaptor bracket is coupled to the second horizontal structural member proximal to the fourth vertical structural side member, and the first seismic adaptor kit further comprises a second seismic brace adapted to couple between the second seismic adaptor bracket and a third seismic adaptor bracket, wherein the third seismic adaptor bracket is coupled to the third horizontal structural member proximal to the first vertical structural side member.

2. The storage rack assembly of claim 1, wherein each vertical structural side member is an extrusion having a length selected to accommodate a desired height in a facility in which the storage rack assembly is installed.

3. The storage rack assembly of claim 1, wherein: the storage rack assembly has a width of 480 mm to 500 mm; and the equipment mounted in the storage rack assembly has a standard width of approximately 450 mm.

4. The storage rack assembly of claim 1, wherein a first set of the vertical structural members, horizontal structural members, and at least one of the one or more seismic adaptor kits are configured to be assembled into a column, the rack assembly further comprising a plurality of columns coupled together.

5. The storage rack assembly of claim 4, wherein each column comprises four of the plurality of vertical structural side members coupled to at least two of the plurality of horizontal structural members.

6. The storage rack assembly of claim 4, wherein the plurality of columns are coupled together side-by-side or stacked vertically.

7. The storage rack assembly of claim 4, wherein one or more of the horizontal structural members in each column includes at least one modular coupling hole used in aligning and coupling the plurality of columns together.

8. The storage rack assembly of claim 1, further comprising at least one accessory coupled to the storage rack assembly.

9. The storage rack assembly of claim 8, wherein each horizontal structural member includes at least one structural accessory coupling hole used in coupling the accessory to the storage rack assembly.

10. The storage rack assembly of claim 4, wherein each column comprises four vertical structural side members coupled to at least two horizontal structural members.

11. The storage rack assembly of claim 1, wherein each side of each horizontal structural member includes a plurality of modular coupling holes used in aligning and coupling a respective horizontal structural member to a respective vertical structural side member.

12. The storage rack assembly of claim 4, wherein each horizontal structural member includes a mounting feature such that at least one of a top plane or a bottom plane of a first column configured to couple to at least one of a top plane or a bottom plane of a second column, such that the first and second columns are stacked in the storage rack assembly.

13. The storage rack assembly of claim 1, wherein the first horizontal structural member includes at least one mounting feature configured for structural anchoring of the storage rack assembly.

14. The storage rack assembly of claim 1, further comprising a second seismic adaptor kit, wherein the second seismic adaptor kit comprises a third seismic brace adapted to couple between a fourth seismic adaptor bracket and a fifth seismic adaptor bracket, and wherein the fourth seismic adaptor bracket is coupled to a second seismic anchor plate coupled to the back face of the first horizontal structural member between the second vertical structural side member and the third vertical structural side member proximal to the second vertical structural side member, and wherein the fifth seismic adaptor bracket is coupled to the second horizontal structural member proximal to the third vertical structural side member, and the second seismic adaptor kit further comprises a fourth seismic brace adapted to couple between the fifth seismic adaptor bracket and a sixth seismic adaptor bracket that is coupled to the third horizontal structural member proximal to the second vertical structural side member.

\* \* \* \* \*